United States Patent [19]

Littlebury et al.

[11] Patent Number: 5,142,449
[45] Date of Patent: Aug. 25, 1992

[54] FORMING ISOLATION RESISTORS WITH RESISTIVE ELASTOMERS

[75] Inventors: Hugh W. Littlebury, Chandler; Charles R. Collis, Phoenix, both of Ariz.

[73] Assignee: Motorola, Inc., Schaumburg, Ill.

[21] Appl. No.: 590,735

[22] Filed: Oct. 1, 1990

[51] Int. Cl.⁵ .............................. H05K 7/12
[52] U.S. Cl. ................... 361/400; 361/413; 324/158 F; 324/158 P; 357/51; 29/619; 29/827; 439/66; 439/87; 439/91
[58] Field of Search .................. 361/400, 405, 413; 338/114, 260, 275, 306, 320; 324/158 F, 158 P; 357/51; 29/827, 619, 621; 439/66, 86, 87, 91, 525

[56] References Cited

U.S. PATENT DOCUMENTS

| | | | |
|---|---|---|---|
| 3,964,087 | 6/1976 | Mallon | 338/306 |
| 4,344,662 | 8/1982 | Dalamangas et al. | 439/91 |
| 4,408,814 | 10/1983 | Takashi et al. | 439/91 |
| 4,626,804 | 12/1986 | Risher et al. | 338/320 X |
| 4,652,973 | 3/1987 | Baker et al. | 439/91 X |
| 4,725,775 | 2/1988 | McMinn | 439/525 X |
| 4,766,371 | 8/1988 | Moriya | 324/158 F |
| 4,843,313 | 6/1989 | Walton | 324/158 F |
| 4,923,404 | 5/1990 | Redmond et al. | 439/86 X |

OTHER PUBLICATIONS

Elastomeric Connector Application Guide, Elastomeric Technologies, Inc.

Primary Examiner—Leo P. Picard
Assistant Examiner—Paramita Ghosh
Attorney, Agent, or Firm—Joe E. Barbee

[57] ABSTRACT

An elastomeric element, having alternating layers of resistive and insulating material, is used to form isolation resistors. A surface of the elastomeric element is contacted with a conductor carrying electrical signals. Another surface is applied to the terminals of a semiconductor component thereby coupling the signals to the semiconductor component through the resistors formed by the elastomeric element.

10 Claims, 2 Drawing Sheets

FORMING ISOLATION RESISTORS WITH RESISTIVE ELASTOMERS

BACKGROUND OF THE INVENTION

The present invention relates, in general, to resistors used to isolate electrical signals, and more particularly, to a novel type of isolation resistor used to isolate signals at the terminals of semiconductor components.

Previous methods for isolating signals of semiconductor components involved connecting individual isolation resistors in series with the terminals of the semiconductor components. This isolated the signal on the terminal from signals on other terminals and on other semiconductor components. This method of providing an isolation was generally used in the industry to prevent the failure of a signal on one terminal of a component from affecting the operation of the other components. Usually the semiconductor components were mounted on a printed circuit board along with the individual isolation resistors. The printed circuit cards on which the resistors were mounted generally were customized for a particular circuit function in a particular package configuration and were not sufficiently flexible to accommodate a variety of package types or component types. Although individual isolation resistors were generally used in the industry, a specific application was for isolating signals on boards used to burn-in semiconductor components. In this application, boards usually had sockets for mounting the semiconductor components during the test or burn-in procedure. After repeated uses, these sockets became worn and had to be replaced. Generally, the replacement procedure damaged the printed circuit board assembly and limited the useful life of the assembly.

Accordingly, it would be desirable to have a flexible method to electrically isolate semiconductor components which accommodates various package types and component types, and which extends the life of the assemblies in which these components are used.

SUMMARY OF THE INVENTION

The objects and advantages of the present invention are achieved by utilizing a resistive elastomeric element to form isolation resistors. A surface of the elastomeric element is contacted with a conductor carrying electrical signals. Another surface is applied to the terminals of a semiconductor component thereby coupling the signals to the semiconductor component through the resistors formed by the elastomeric element.

DETAILED DESCRIPTION OF THE DRAWINGS

The present invention provides a technique for isolating the signal terminals of semiconductor components by using resistive elastomeric elements to form isolation resistors. The resistive elastomer is constructed of many thin alternating layers of resistive and insulating material. The resistive characteristic of the elastomer is used as a method for providing isolation resistors in series with the terminals of semiconductor components.

While the invention is described with specific preferred embodiments, it is evident that many alternatives and variations will be apparent to those skilled in the art. More specifically, the invention has been described with a particular implementation applicable to a resistive elastomeric connection assembly for semiconductor components although the method is directly applicable to other assemblies, as well as to other applications.

Figure 1:
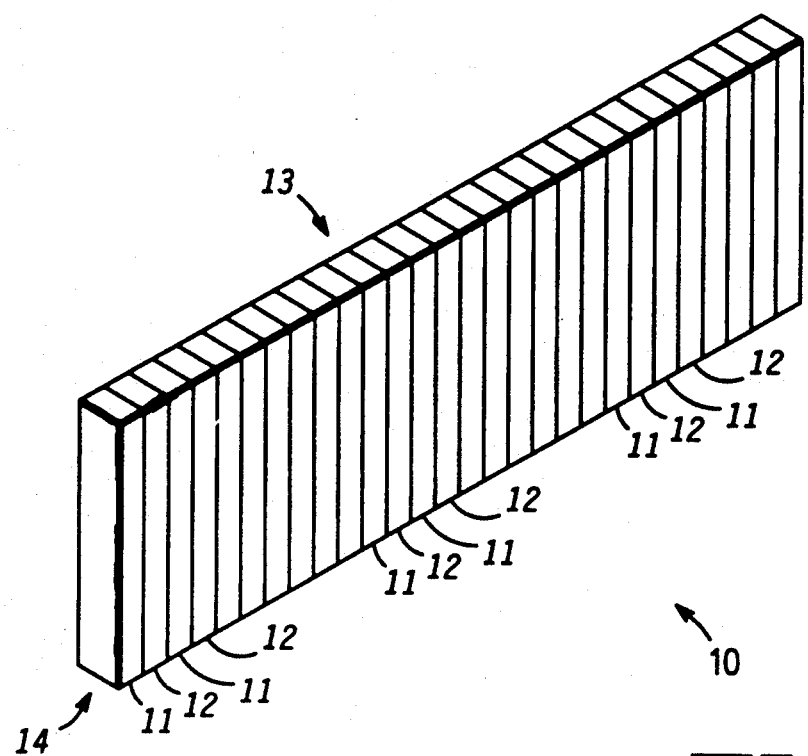
FIG. 1 is a perspective view of a resistive elastomeric element in accordance with the present invention.

FIG. 1 is a perspective view of a resistive elastomeric element 10 which has many thin alternating layers of an insulating elastomeric material 11 and a resistive elastomeric material 12. The resistance of layer 12 can be varied by using various conductive materials to manufacture layer 12 and also by varying the dimensions of element 10. The resistance is directly proportional to the height of element 10 (increases with increased height), and inversely proportional to the area of the surface of layer 12 that is making contact (decreases with increased area). In the preferred embodiment, resistive layers 12 are a silicone rubber containing a conductive material, while insulating layers 11 are a silicone rubber that does not have conductive material. Also in this preferred embodiment, the resistance of layer 12 is between five hundred ohms and five thousand ohms. The resistive properties of element 10 are used to form isolation resistors. Resistive layers 12 form a set of resistors having surface 13 of element 10 as a first terminal for connecting to the resistor and surface 14 as a second terminal. By placing surface 13 in contact with the leads or terminals of a semiconductor component and utilizing surface 14 as a second contact, element 10 forms a set of series resistors with each resistor having a first terminal connected to a terminal of the semiconductor component and a second terminal of the resistor formed by surface 14. In the preferred embodiment, a section of element 10 approximately 2.1 centimeters long provides contact to eight terminals on one side of a sixteen pin dual in line integrated circuit package. In this embodiment, the individual layers of element 10 have a spacing of approximately 1960.0 microns (about one sixth the width of the semiconductor terminals), therefore, at least five resistive layers of element 10 will always be in contact with each terminal even if the element is misaligned to the semiconductor component. This insures at least one resistive layer will be in contact with the terminal of the semiconductor component and provide an isolation resistor in series with the terminal. Contact to surface 14 is provided with a pattern of conductors that mechanically contact the resistive layers of surface 14. In the preferred embodiment, surface 14 is contacted with a pattern of conductors on a printed circuit board wherein the conductor pattern also provides interconnect to other signals on the printed circuit board. Therefore, the resistive characteristics of element 10 enables the formation of isolation resistors in series with the terminals of semiconductor components simply by contacting the terminals, while the thin layers minimize the impact of misalignment with the terminals. Material to make element 10 is available from Shin-Etsu Polymer of Union City, Calif. as model number S-05.

Figure 2:
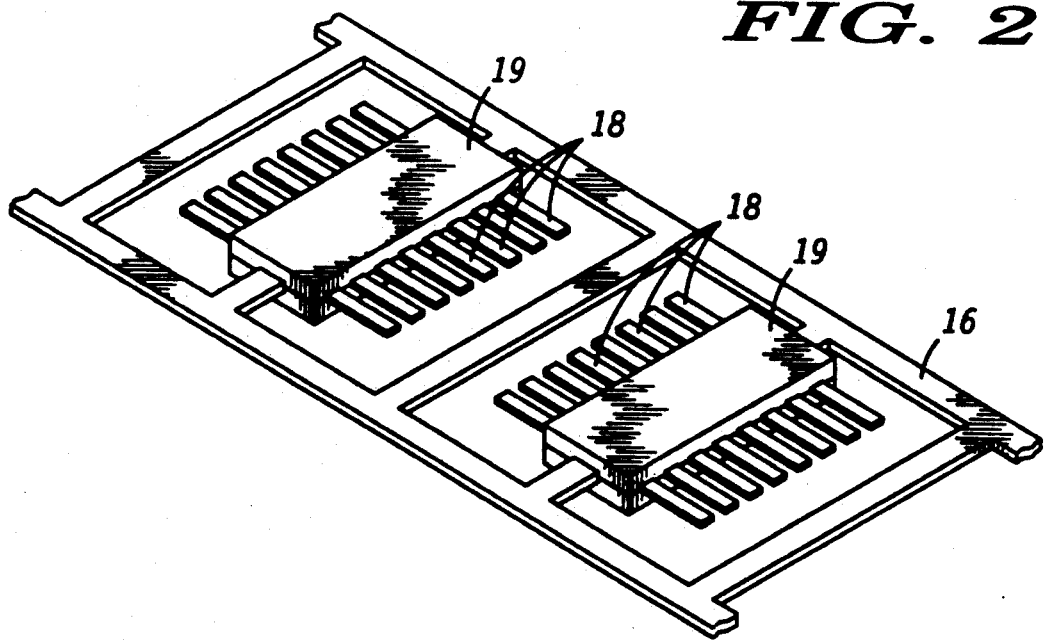
FIG. 2 is an overhead view of a lead-frame with an encapsulated semiconductor component having free-floating leads suitable for use with the current invention.

FIG. 2 shows a portion of a lead frame 16 supporting several semiconductor components 19 each having free-floating leads 18. Generally, the configuration as shown in FIG. 2 is a common step in the manufacturing cycle of a semiconductor component, and provides a convenient handling form in which the semiconductor components can be transported, tested, burned-in, etc. with minimal damage to leads 18. Semiconductor components 19 supported by lead frame 16 provide a convenient form for the use of resistive elastomeric elements to contact leads 18. This form can be used for testing, burning-in, or operations required to be preformed on semiconductor components 19.

Figure 3:
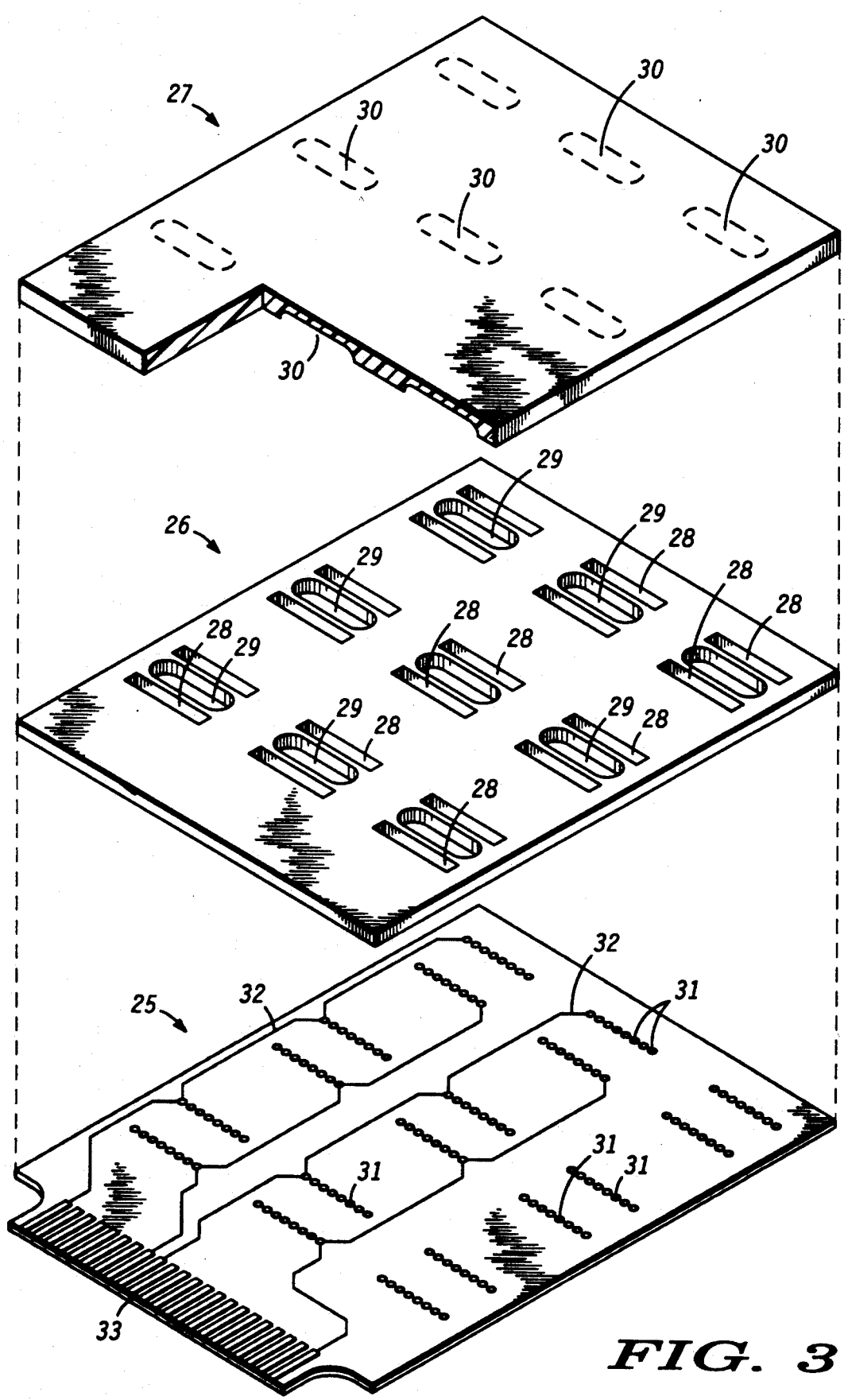
FIG. 3 is an exploded view, with a portion cutaway, of an implementation of a resistive elastomeric connection assembly suitable for use with the present invention.

FIG. 3 is an implementation of a resistive elastomeric connection assembly suitable for using resistive elastomeric elements as series resistors for isolating semiconductor components. In the preferred embodiment, the connection assembly of FIG. 3 is especially suitable for using resistive elastomeric elements to electrically isolate semiconductor components supported by a lead frame as shown in FIG. 2. A printed circuit board 25 provides a predetermined pattern for contacting the resistors formed by the resistive elastomeric elements and for interconnecting the resistors. Conducting contacts or pads 31 are arranged in a pattern on board 25 which matches the pattern of the semiconductor component terminals that will be contacted by the elastomeric elements. Conductors 32 interconnect pads 31 in a predetermined pattern and also provide connection to a means 33 for providing external connection which provides connection to circuits external to the assembly. A non-conducting spacer 26 has slots 28 through the spacer to hold the elastomeric elements in position relative to pads 31. Semiconductor components are arranged on spacer 26 so that the body of the component is situated in opening 29. Opening 29 prevents the body of the semiconductor component from touching the surface of spacer 26 thereby maintaining contact between the elastomeric elements and the terminals of the semiconductor components. The elastomeric elements have sufficient height to extend through spacer 26 thereby contacting pads 31 and the terminals of the semiconductor components on spacer 26. Pads 31 provide contact to a surface of the elastomeric elements corresponding to surface 14 in FIG. 1 while a surface of the elastomeric elements corresponding to surface 13 in FIG. 1 contacts the terminals or leads 18 of the semiconductor components. Therefore, the elastomeric elements form resistors connected in series with the terminals of the semiconductor components. A non-conducting cover 27 is used for applying pressure to press the leads of the semiconductor components against the elastomeric elements, and the elements against pads 31. Cover 27 also has recesses 30 which prevent pressure from being applied to the body of the semiconductor component. The pressure from cover 27 compresses the elastomeric elements. The amount of compression is determined by the thickness of spacer 26. The thickness of spacer 26 must also be sufficient to prevent the body of the semiconductor components from contacting board 25. The entire assembly forms an interconnection system suitable for the use of resistive elastomeric elements to electrically isolate semiconductor components. The assembly structure is suitable for accommodating a larger quantity of semiconductor components than shown in FIG. 3. The arrays shown on board 25, spacer 26, and cover 27 were limited for the purpose of drawing clarity. Generally, the arrays would be capable of housing a much larger quantity of components than shown. A new set of semiconductor components can be interconnected by removing cover 27 and the semiconductor components, placing new components on spacer 26, and replacing cover 27. Various package types can be accommodated by different versions of board 25 having different interconnect patterns, and with corresponding configurations for spacer 26 and cover 27. This interconnect system is one example of providing isolation resistors with resistive elastomeric elements. The use of resistive elastomeric elements to provide isolation resistors is directly applicable to other semiconductor package types, to other interconnect patterns, and to other applications requiring series resistors such as isolating signals on two cables, etc.

By now it should be appreciated that there has been provided a novel way to form isolation resistors for semiconductor components. The use of resistive elastomeric elements to form isolation resistors provides the mechanism for configuring flexible semiconductor interconnect systems. The use of resistive elastomers for isolation resistors can be used for a variety of interconnect systems in many configurations to eliminate the need for individual isolation resistors mounted on boards, and to eliminate the need for sockets or other component connectors. An interconnect system facilitated by the resistive elastomeric elements provides a high degree of flexibility for assemblies used for final testing and burn-in of semiconductor components. Sockets are no longer required, thereby eliminating damages to the assembly caused by repair operations and extending the useful life of the assembly. One interconnect system can be used for testing or burn-in a variety of semiconductor package types thereby lowering costs and improving manufacturing efficiency. In addition, lead or pin damage to the semiconductor device is eliminated since the device is no longer plugged into a socket.

We claim:

1. A method for electrically isolating semiconductor components with resistive elastomeric elements which comprises:

providing a substrate having a predetermined interconnect pattern and a means for providing an external connection;

providing a plurality of resistive elastomeric elements;

covering the substrate with a spacer having a plurality of slots that extent through the spacer and also having a plurality of openings through the spacer wherein the plurality of slots are positioned near an edge of the plurality of openings and each slot maintains one resistive elastomeric element in a predetermined position relative to the substrate and facilitates contact to the predetermined interconnect pattern on the substrate;

coupling terminals of a plurality of semiconductor components to the predetermined interconnect pattern wherein the plurality of semiconductor components are arranged in a predetermined pattern on the spacer with each semiconductor component aligned to one of the plurality of openings and the terminals of the plurality of semiconductor components contacting the resistive elastomeric elements which function as series resistors between the terminals and the predetermined interconnect pattern so that the resistive elastomeric elements form isolation resistors between the terminals and the predetermined interconnect pattern; and maintaining contact between the terminals, the resistive elastomeric elements, and the predetermined interconnect pattern by using a non-conducting cover having recesses positioned in a pattern that corresponds to the predetermined pattern of the semiconductor components and further including the cover pressing the terminals of the semiconductor components against the resistive elastomeric elements thereby pressing the elastomeric elements against the substrate wherein the recesses prevent pressure from being applied to the semiconductor components.

2. The method of claim 1 wherein the providing the substrate step includes providing a printed circuit board substrate having conducting pads arranged in a pattern corresponding to the terminals of the semiconductor components and having the conducting pads interconnected in a predetermined pattern which includes coupling to the means for providing an external connection.

3. The method of claim 1 wherein providing the plurality of resistive elastomeric elements includes providing resistive elastomeric elements having alternating layers of conductive and non-conductive silicone wherein the spacing between the layers is less than one sixth the width of the terminals of the semiconductor components.

4. The method of claim 1 wherein providing the plurality of resistive elastomeric elements includes providing resistive elastomeric elements having alternating layers of conductive and non-conductive silicon wherein the resistive layers have a resistance between five hundred ohms and five thousand ohms.

5. Apparatus for testing semiconductor components which comprises:
   at least one semiconductor component having a plurality of terminals;
   resistive elastomeric elements forming isolation resistors between the terminals of the semiconductor component and electrical leads carrying a signal;
   means for holding the resistive elastomeric elements with the means for holding having openings through the means for holding and also having slots through the means for holding wherein the semiconductor component is positioned on the means for holding so that the semiconductor component is substantially aligned to one opening and wherein at least one slot is positioned near an edge of each opening and one resistive elastomeric element is positioned within each slot whereby at least one resistor is coupled between each terminal of the semiconductor component and one of the electrical leads; and
   a cover having recesses wherein the cover presses the plurality of terminals against the resistive elastomeric elements and the recesses prevent pressure from being applied to a body of the semiconductor component.

6. The method of claim 1 wherein the resistive elastomeric elements have alternating layers of resistive material and conductive material whereby the resistive material forms resistors having a resistance of between 500 and 5,000 ohms.

7. Apparatus for electrically isolating semiconductor components which comprises:
   a circuit board having a plurality of contacts;
   a plurality of resistive elastomeric elements;
   a spacer having slots through the spacer for holding the resistive elastomeric elements and also having a plurality of openings through the spacer;
   a plurality of semiconductor components on the spacer wherein the semiconductor components are substantially aligned to the openings;
   a means for pressing leads of the semiconductor components against the resistive elastomeric elements and the resistive elastomeric elements against the contacts to complete contact to the circuit board wherein the resistive elastomeric elements form isolation resistors between the leads and the contacts and wherein the means for pressing leads has recesses that are aligned to the openings in the spacer for the purpose of preventing pressure from being applied to the body of the semiconductor component.

8. A method of isolating electrical signals which comprises:
   coupling leads of a semiconductor device to resistive elastomeric elements;
   coupling the resistive elastomeric elements to conductors wherein the resistive elastomeric elements form isolation resistors coupled in series between the leads and the conductors;
   holding the resistive elastomeric elements in slots that are through a spacer which is positioned between the leads and the conductors wherein the spacer has openings that are aligned to the semiconductor device and the slots are positioned parallel to edges of the openings; and
   pressing the leads against the resistive elastomeric elements by using a cover having recesses that are aligned to the openings wherein the recesses prevent pressure from being applied to a body of the semiconductor device.

9. The method of claim 8 wherein the coupling leads step includes coupling resistive elastomeric elements having alternating layers of resistive material and conductive material whereby the resistive material forms resistors coupled to the signals.

10. The method of claim 8 wherein the coupling leads step includes contacting a surface of the resistive elastomeric elements with the leads.

* * * * *

UNITED STATES PATENT AND TRADEMARK OFFICE
CERTIFICATE OF CORRECTION

PATENT NO. : 5,142,449
DATED : August 25, 1992
INVENTOR(S) : Hugh W. Littlebury et al.

It is certified that error appears in the above-indentified patent and that said Letters Patent is hereby corrected as shown below:

Claim 1, Column 4, line 48, change "extent" to --extend--.

Signed and Sealed this

Twenty-second Day of November, 1994

Attest:

BRUCE LEHMAN

Attesting Officer     Commissioner of Patents and Trademarks